United States Patent [19]
Ishikawa et al.

[11] Patent Number: 5,574,884
[45] Date of Patent: Nov. 12, 1996

[54] DRAM CONTROL CIRCUIT

[75] Inventors: Osamu Ishikawa; Toshikazu Ito, both of Tokyo, Japan

[73] Assignee: Oki Electric Industry Co., Ltd., Tokyo, Japan

[21] Appl. No.: 302,035

[22] Filed: Sep. 9, 1994

[30] Foreign Application Priority Data

Sep. 17, 1993 [JP] Japan .................................. 5-231641

[51] Int. Cl.$^6$ ........................................................ G11C 7/00
[52] U.S. Cl. ........................... 395/482; 364/DIG. 1; 364/260; 364/244; 395/432
[58] Field of Search .............................. 395/431, 432, 395/481, 482, 494, 496; 365/189.03, 230.01, 230.08, 233, 236, 238.5

[56] References Cited

U.S. PATENT DOCUMENTS

| | | | |
|---|---|---|---|
| 5,469,558 | 11/1995 | Lieberman et al. | 395/285 |
| 5,479,111 | 12/1995 | Matsuura | 326/24 |
| 5,488,691 | 1/1996 | Fuoco et al. | 395/185.05 |
| 5,491,828 | 2/1996 | Intrater et al. | 395/800 |

FOREIGN PATENT DOCUMENTS 0037239  10/1981  European Pat. Off. .
0503375  9/1992  European Pat. Off. .

OTHER PUBLICATIONS

"HB56G51232 Series, Hitachi IC Memory Data Book 3", *Semiconductor Division, Hitachi Co., Ltd.*, 14th edition, 1992, pp. 922–924.

*Primary Examiner*—Rebecca L. Rudolph
*Attorney, Agent, or Firm*—Spencer & Frank

[57] ABSTRACT

A DRAM control circuit according to the present invention, comprising a DRAM, a DRAM controller adapted for receiving an address, write data, and a data rewrite command from a host controller and designating a row address and a column address to the DRAM, and a column address strobe signal control circuit, causes pseudo column address strobe signal DCASq-N to have "L" level to read the contents of the address when column address strobe signal DCAS-N and read signal RD-N have "L" level, causes pseudo column address strobe signal DCASq-N to have "H" level to set an input/output terminal I/O to high impedance when the read signal RD-N has "H" level, further causes pseudo write signal WR-q to have "L" level to output write data to a data bus when the input/output terminal I/O remains at the high impedance, and rewrites the contents of the address to the write data when the pseudo column address strobe signal DCASq-N is caused to have "L" level.

4 Claims, 2 Drawing Sheets

DRAM CONTROL CIRCUIT

BACKGROUND OF THE INVENTION

1. Field of the Invention

The present invention relates to a DRAM (Dynamic Random Access Memory) for performing a read modify write process.

2. Description of the Related Art

Conventionally, a DRAM control circuit for performing a read modify write process comprises a DRAM controller and a DRAM. The DRAM controller receives an address, write data, and data rewrite command from a host controller. The DRAM controller designates a row address and a column address to the DRAM. In addition, the DRAM controller causes the signal levels of a row address strobe signal, a column address strobe signal, and a read signal to become "L". After the DRAM controller reads the contents of the address through a data bus, the DRAM controller causes the signal level of the read signal to become "H" level and subsequently the write signal to "L" level, then transmits write data to the DRAM.

On the other hand, when the signal levels of a row address strobe terminal, a column address strobe terminal, and an output enable terminal of the DRAM are "L", the DRAM controller outputs the content of the address designated from the input/output terminal to the data bus. When the signal level of the read/write terminal is "L", the DRAM controller inputs the write data to the DRAM through the input/output terminal through the data bus and rewrites the content of the designated address with the write data.

However, a commercial DRAM is designed so that the output enable terminal is grounded. (Refer to "HB56G51232 Series, Hitachi IC Memory Data Book 3", Semiconductor Division, Hitachi Co., Ltd., 14-th edition, pp. 922–924, 1992.

Thus, in the DRAM control circuit, after a read cycle, although a row address and a column address were designated, the signal level of the output enable terminal of the DRAM is "L". Thus, the data bus cannot be switched for the data write operation. After the read cycle, the DRAM controller causes the signal levels of the row address strobe signal and the column address strobe signal to become "L", designates the row address and the column address to the DRAM, and causes the signal level of the write signal to become "L", and rewrites the content of the address of the DRAM with the write data. Thus, the number of cycles of the read modify write process becomes long.

SUMMARY OF THE INVENTION

An object of the present invention is to provide a DRAM control circuit for decreasing the number of bus cycles for data rewrite operation so as to reduce the number of cycles of read modify write process.

To accomplish the above object, a DRAM control circuit according to the present invention having a DRAM controller and a DRAM, the DRAM controller adapted for receiving an address, write data, and a data rewrite command from a host controller and designating a row address and a column address to the DRAM and causing the signal levels of a row address strobe signal, a column address strobe signal, and a read signal to become "L", reading the contents of the addresses through a data bus connected to an input/output terminal of the DRAM, causing the signal level of the read signal to become "H", causing the signal level of the write signal that is output to a read/write terminal of the DRAM to become "L", and rewriting the contents of the addresses with the write data, comprising a column address strobe signal control circuit for generating a pseudo column address strobe signal and a pseudo write signal corresponding to the column address strobe signal, the read signal, and the write signal and for inputting the pseudo column address strobe signal and the pseudo write signal to a column address strobe terminal of the DRAM and the read/write terminal of the DRAM, respectively, and a means for causing the signal level of the pseudo column address strobe signal to become "L" so as to read the contents of the addresses when the signal levels of the column address strobe signal and the read signal become "L", for causing the signal level of the pseudo column address strobe signal to become "H" level so as to cause the input/output terminal become high impedance state when the signal level of the read signal becomes "H", for causing the signal level of the pseudo write signal to become "L" so as to output the write data to the data bus when the input/output terminal is high impedance state, and for rewriting the contents of the addresses with the write data when the signal level of the pseudo column address strobe signal is "L".

Thus, according to the present invention, even if the signal level of the output enable terminal of the DRAM is "L", after a read cycle, the data bus can be switched for the data write operation without need to reassign the row address and the column address. Thus, the number of bus cycles for the data rewrite operation can be decreased and thereby the number of cycles of the read modify write process can be reduced.

These and other objects, features and advantages of the present invention will become more apparent in light of the following detailed description of a best mode embodiment thereof, as illustrated in the accompanying drawings.

DESCRIPTION OF THE PREFERRED EMBODIMENTS

Figure 1:
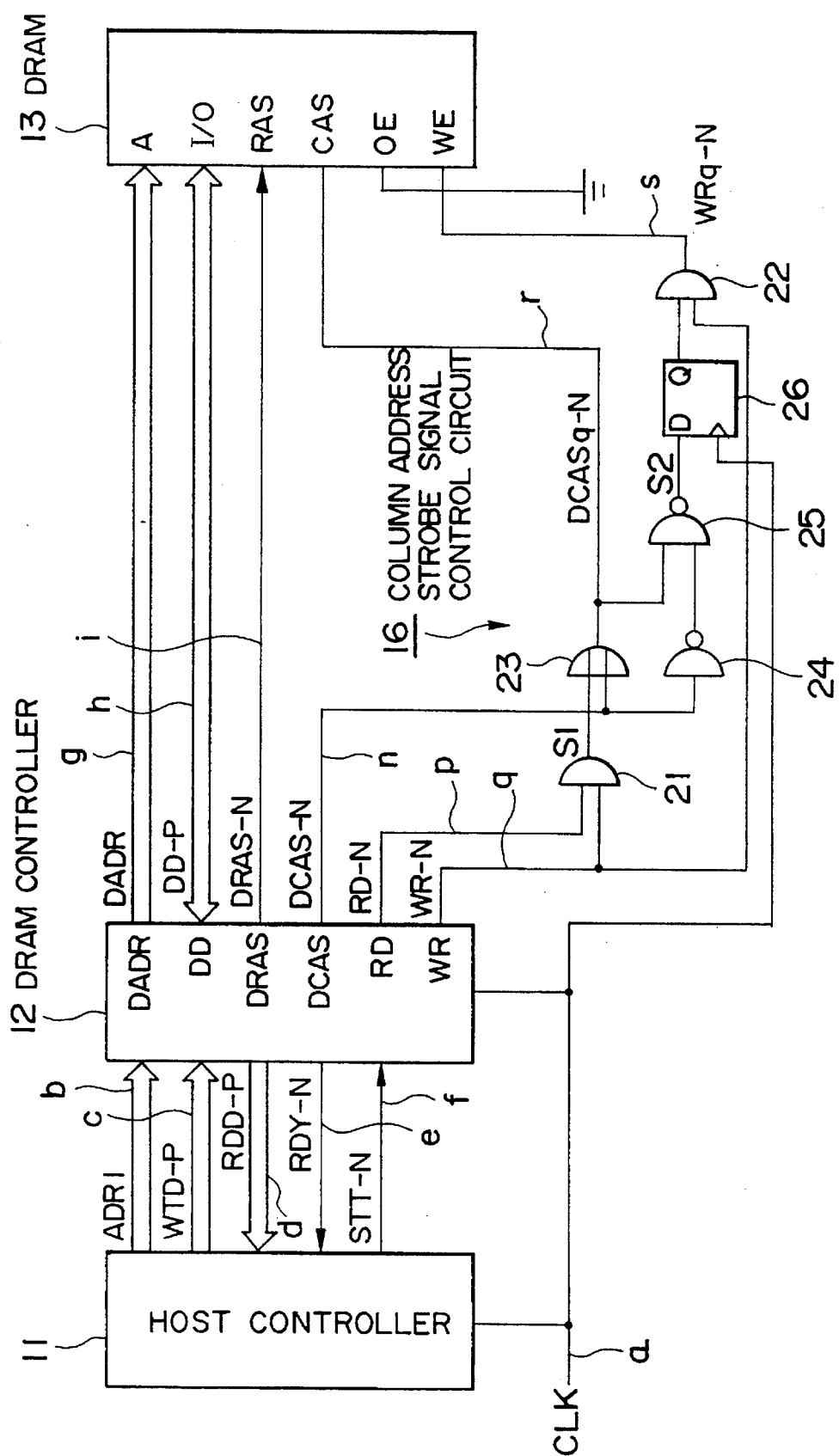
FIG. 1 is a block diagram showing a DRAM control circuit according to an embodiment of the present invention.

With reference to the accompanying drawings, an embodiment of the present invention will be described. Common portions in the drawings are denoted by common reference numerals.

FIG. 1 is a block diagram showing a DRAM control circuit according to the embodiment of the present invention. The DRAM control circuit 10 comprises a DRAM controller 12, a DRAM 13, and a column address strobe signal control circuit. The DRAM controller 12 is connected to a host controller 11. The host controller 11, the DRAM controller 12, and the column address strobe signal control circuit are connected to a clock signal line a. A clock signal CLK that is an operation timing signal is supplied to the host controller 11, the DRAM controller 12, and the column address strobe signal control circuit 16 through the clock signal line a. The DRAM controller 12 and the host controller 11 are connected with an address bus b, a write data bus c, a read data bus d, and signal lines e and f. The address bus b transmits an address ADR1 from the host controller 11 to the DRAM controller 12. The write data bus c transmits write data WTD-P from the host controller 11 to the DRAM controller 12. The read data bus d transmits read data RDD-P from the DRAM controller 12 to the host controller 11.

The signal line e transmits a ready signal RDY-N that represents a sample timing of the read data RDD-P from the DRAM controller 12 to the host controller 11. The signal line f transmits a start signal STT-N that represents the start of the bus cycle from the host controller 11 to the DRAM controller 12.

On the other hand, the DRAM controller 12 and the DRAM 13 are connected with an address bus g, a data bus h, and signal lines i, n, p, q, r, and s. The address bus g is connected between a terminal DADR of the DRAM controller 12 and a terminal A of the DRAM 13. The address bus g transmits a row address DADR and a column address DADR from the DRAM controller 12 to the DRAM 13. The data bus h is connected between a terminal DD of the DRAM controller 12 and an input/output terminal I/O of the DRAM 13. The data bus h transmits data DD-P between the DRAM controller 12 and the DRAM 13.

The signal line i is connected between a terminal DRAS of the DRAM controller 12 and a row address strobe terminal RAS of the DRAM 13. The signal line i transmits a row address strobe signal DRAS-N from the DRAM controller 12 to the DRAM 13. The signal line n is connected between a terminal DCAS of the DRAM controller 12 and the column address strobe signal control circuit 16. The signal line n transmits a column address strobe signal DCAS-N from the DRAM controller 12 to the column address strobe signal control circuit 16. The signal line p is connected between a terminal RD of the DRAM controller 12 and the column address strobe signal control circuit 16. The signal line p transmits a read signal RD-N from the DRAM controller 12 to the column address strobe signal control circuit 16.

The signal line q is connected between a terminal WR of the DRAM controller 12 and the column address strobe signal control circuit 16. The signal line q transmits a write signal WR-N from the DRAM controller 12 to the column address strobe signal control circuit 16. The signal line r is connected between the column address strobe signal control circuit 16 and a column address strobe terminal CAS of the DRAM 13. The signal line r transmits a pseudo column address strobe signal DCASq-N from the column address strobe signal control circuit 16 to the DRAM 13. The signal line s is connected between the column address strobe signal control circuit 16 and a read/write terminal WE of the DRAM 13. The signal line s transmits a pseudo write signal WRq-N from the column address strobe signal control circuit 16 to the DRAM 13.

The signal level of the output enable terminal OE of the DRAM 13 is always "L".

The column address strobe signal control circuit 16 comprises AND gates 21 and 22, an OR gate 23, an inverter 24, a NAND gate 25, and a D-type flip-flop 26. The AND gate 21 inputs the read signal RD-N and the write signal WR-N. The OR gate 23 inputs an output signal of the AND gate 21 and the column address strobe signal DCAS-N and outputs the pseudo column address strobe signal DCASq-N. The inverter 24 inputs the pseudo column address strobe signal DCASq-N. The NAND gate 25 inputs output signals of the OR gate 23 and the inverter 24. An output signal of the NAND gate 25 is input to the D-type flip-flop 26. The AND gate 22 inputs an output signal of the D-type flip-flop 26 and the write signal WR-N and outputs the pseudo write signal WRq-N.

Thus, the read signal RD-N and the write signal WR-N, which are output from the DRAM controller 12, are input to the AND gate 21. The AND gate 21 outputs a logical product S1. The logical product S1 is input to the OR gate 23 along with the column address strobe signal DCAS-N. The OR gate 23 outputs a logical sum that is the pseudo address strobe signal DCASq-N. The pseudo column address strobe signal DCASq-N is input to the column address strobe terminal CAS of the DRAM 13.

The column address strobe signal DCAS-N is input to the inverter 24 and an inverted signal is input to the NAND gate 25. The NAND gate 25 inputs an output signal of the inverter 24 and the pseudo column address strobe signal DCASq-N and outputs an inverted logical product S2 to the D-type flip-flop 26. The D-type flip-flop 26 outputs the inverted logical product S2 to the AND gate 22 in synchronization with a timing of the clock signal CLK. The AND gate 22 inputs the inverted logical product S2 and the write signal WR-N and outputs the logical product that is the pseudo write signal WRq-N to the read/write terminal WE of the DRAM 13.

Figure 2:
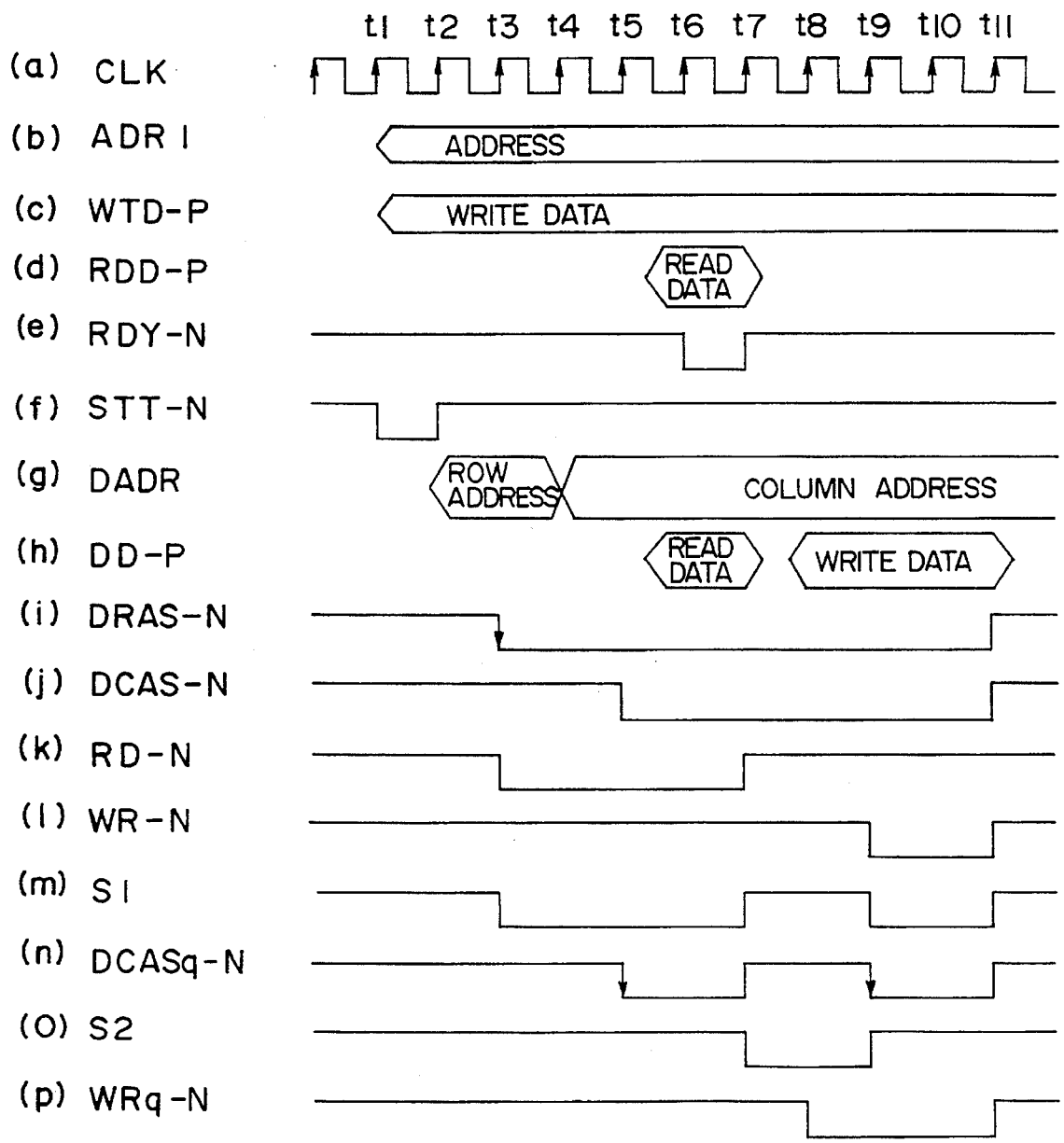
FIG. 2 is a timing chart of the DRAM control circuit according to the embodiment of the present invention.

Next, with reference to FIG. 2, the operation of the read modify write process will be described. FIG. 2 is a timing chart of the DRAM control circuit according to the embodiment of the present invention.

The host controller 11 transmits the address ADR1 and the write data WTD-P to the DRAM controller 12 in synchronization with a timing t1 in high level of the clock signal CLK. The host controller 11 causes the signal level of the start signal STT-N to become "L" for one period of the clock signal CLK so as to command the DRAM controller 12 to rewrite the data DD-P and access the DRAM 13.

When the DRAM controller 12 detects the "L" level of the start signal STT-N, it selects a predetermined address line of the address bus b for transmitting the row address DADR. The DRAM controller 12 outputs the row address DADR to the address bus g in synchronization with a timing t2 in high level of the clock signal CLK.

The DRAM controller 12 causes the signal level of the row address strobe signal DRAS-N to become "L" in synchronization with a timing t3 in high level of the clock signal CLK. The low address DADR that is output to the address bus g is latched to the DRAM 13. The DRAM controller 12 causes the signal level of the read signal RD-N to become "L" and the signal level of the logical product S1 of the AND gate 21 to become "L".

The DRAM controller 12 selects a predetermined address line of the address bus b for transmitting the column address DADR and outputs the column address DADR to the address bus g in synchronization with a timing t4 in high level of the clock signal CLK. The DRAM controller 12 causes the signal level of the column address strobe signal to become "L" in synchronization with a timing t5 in high level of the clock signal CLK. The column address DADR that is output to the address bus g is latched to the DRAM 13. In addition, the DRAM controller 12 causes the signal level of the pseudo column address strobe signal DCASq-N to become "L".

When the signal levels of the row address strobe signal DRAS-N and the column address strobe signal DCAS-N along with the signal level of the output enable terminal OE become "L", the DRAM 13 outputs the row address DADR being latched and the data DD-P of the address ADR1 selected by the column address DADR to the data bus h at a predetermined timing.

On the other hand, the DRAM controller 12 outputs the data DD-P transmitted through the data bus h to the read data bus d and causes the signal level of the ready signal RDY-N to become "L" for one period of the clock signal CLK in synchronization with a timing t6 in high level of the clock signal CLK and commands the host controller 11 for a sample timing for reading the data DD-P. The host controller 11 detects the "L" level of the ready signal RDY-N and receives the data DD-P that is the read data RDD-P that is output to the read data bus d.

The DRAM controller 12 causes the signal level of the read signal RD-N to become "H" in synchronization with a timing t7 in high level of the clock signal CLK. Thus, the pseudo column address strobe signal DCASq-N of the column address strobe signal control circuit 16 becomes "H". Since the signal level of the read signal RD-N is "H", the signal level of the logical product S1 becomes "H". The signal level of the inverted logical product S2 becomes "L".

When all the signal levels of the row address strobe terminal RAS, the column address strobe terminal CAS, and the output enable terminal OE become "L", the DRAM 13 outputs data from the input/output terminal I/O.

According to the present invention, when the signal level of the pseudo column address strobe signal DCASq-N becomes "H", the signal level of the column address strobe terminal CAS of the DRAM 13 becomes "H". Thus, the input/output terminal I/O becomes high impedance state. Consequently, the DRAM 13 prohibits data from being output to the data bus h at a predetermined timing.

Thus, even if the signal level of the output enable terminal OE of the DRAM 13 is "L", when the signal level of the column address strobe terminal CAS becomes "H", the input/output terminal I/O become high impedance state.

Consequently, the data DD-P of the address ADR1 selected by the row address DADR and the column address DADR can be read as the read data DD-P. After the data DD-P is completely read, since the input/output terminal I/O becomes high impedance state, the write data WTD-P can be written.

When the signal level of the pseudo write signal WRq-N becomes "L" in synchronization with a timing t8 in high level of the clock signal CLK, the DRAM controller 12 outputs the data DD-P that is the write data WTD-P of the write data bus to the data bus h. The DRAM controller 12 causes the signal level of the write signal WR-N to become "L" in synchronization with a timing t9 in high level of the clock signal CLK. Thus, the signal level of the pseudo column address strobe signal DCASq-N that is "H" at the timing t7 in high level of the clock signal CLK becomes "L". Since the signal level of the write signal WR-N is "L", the signal level of the logical product S1 becomes "L". Thus, the signal level of the inverted logical product S2 becomes "H".

Consequently, the DRAM 13 latches the column address DADR that is the address ADR1, which is output to the address bus g at the timing t9 in high level of the clock signal CLK. The column address DADR is the same as the column address DADR, which is latched at the timing t5 in high level of the clock signal CLK.

Since the signal level of the read/write terminal WE of the DRAM 13 is "L" due to the pseudo write signal WRq-N at the timing t8 in high level of the clock signal CLK, the new data DD-P is written to the address DADR selected by both the row address DADR latched at the timing t3 in high level of the clock signal CLK and the column address ADR1 latched at the timing t9 thereof through the data bus h.

The DRAM controller 12 causes the signal levels of the row address strobe signal DRAS-N, the column address strobe signal DCAS-N, and the write signal WR-N to "H" in synchronization with a timing t11 in high level of the clock signal CLK and completes the read modify write process.

Thus, when the data DD-P is written, it is not necessary to set the row address DADR again, thereby decreasing the number of bus cycles and reducing rewrite time of the data DD-P.

According to the above-described embodiment, each control signal is output in synchronization with a timing in high level of the clock signal CLK. However, as long as timing conditions that the DRAM 13 requires are satisfied, another timing generating means such as a relay may be used.

In addition, since the present invention can be applied to a DRAM where the signal level of an output enable terminal thereof is not "L", the present invention can be applied to a DRAM module that have DRAMs, one of which has an output enable terminal OE that is grounded and the other of which has an output enable terminal OE that is not grounded.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A DRAM control circuit having a DRAM controller and a DRAM, the DRAM controller adapted for receiving an address, write data, and a data rewrite command from a host controller and designating a row address and a column address to the DRAM and causing the signal levels of a row address strobe signal, a column address strobe signal, and a read signal to become "L", reading the contents of the addresses through a data bus connected to an input/output terminal of the DRAM, causing the signal level of the read signal to become "H", causing the signal level of the write signal that is output to a read/write terminal of the DRAM to become "L", and rewriting the contents of the addresses with the write data, comprising:

a column address strobe signal control circuit for generating a pseudo column address strobe signal and a pseudo write signal corresponding to the column address strobe signal, the read signal, and the write signal and for inputting the pseudo column address strobe signal and the pseudo write signal to a column address strobe terminal of the DRAM and the read/write terminal of the DRAM, respectively; and means for causing the signal level of the pseudo column address strobe signal to become "L" so as to read the contents of the addresses when the signal levels of the column address strobe signal and the read signal become "L", for causing the signal level of the pseudo column address strobe signal to become "H" level so as to cause the input/output terminal become high impedance state when the signal level of the read signal becomes "H", for causing the signal level of the pseudo write signal to become "L" so as to output the write data to the data bus when the input/output terminal is high impedance state, and for rewriting the contents of the addresses with the write data when the signal level of the pseudo column address strobe signal is "L".

2. The DRAM control circuit as set forth in claim 1, wherein said column address strobe signal control circuit includes:

pseudo column address strobe signal generating means for generating a pseudo column address strobe signal corresponding to the column address strobe signal, the read signal, and the write signal; and pseudo write signal generating means for generating a pseudo write signal corresponding to the pseudo column address strobe signal, the column address strobe signal, and the write signal.

3. The DRAM control circuit as set forth in claim 2, wherein said pseudo column address strobe signal generating means includes:

an AND gate for inputting the read signal and the write signal; and an OR gate for inputting an output signal of the AND gate and the column address strobe signal and for outputting a pseudo column address strobe signal.

4. The DRAM control circuit as set forth in claim 3, wherein said pseudo write signal generating means includes:

an inverter for inputting the column address strobe signal;

an NAND gate for inputting output signals of the inverter and the OR gate;

a D-type flip-flop for inputting an output signal of the NAND gate; and an AND gate for inputting output signals of the D-type flip-flop and the write signal and for outputting a pseudo write signal.

* * * * *